United States Patent
Ogawa

(10) Patent No.: US 6,741,094 B2
(45) Date of Patent: May 25, 2004

(54) ELECTRONIC APPARATUS TEST CIRCUIT

(75) Inventor: Takao Ogawa, Suwa (JP)

(73) Assignee: Seiko Epson Corporation, Tokyo (JP)

(*) Notice: Subject to any disclaimer, the term of this patent is extended or adjusted under 35 U.S.C. 154(b) by 18 days.

(21) Appl. No.: 10/273,170

(22) Filed: Oct. 18, 2002

(65) Prior Publication Data

US 2003/0093724 A1 May 15, 2003

(30) Foreign Application Priority Data

Oct. 18, 2001 (JP) ........................................ 2001-320772

(51) Int. Cl.[7] .............................. H03K 19/00; G06F 3/00
(52) U.S. Cl. ............................. 326/16; 326/93; 710/58
(58) Field of Search ...................... 326/16, 93; 710/58, 710/65

(56) References Cited

U.S. PATENT DOCUMENTS 6,202,103 B1 * 3/2001 Vonbank et al. ............... 710/15

FOREIGN PATENT DOCUMENTS

| JP | A 2001-289913 | 10/2001 | | |
|---|---|---|---|---|
| JP | 2002303656 A | * 10/2002 | ......... | G01R/31/317 |

* cited by examiner

*Primary Examiner*—Daniel D. Chang
(74) *Attorney, Agent, or Firm*—Oliff & Berridge, PLC

(57) ABSTRACT

The invention provides an electronic apparatus test circuit that can reduce the testing time and cost without relying on a PLL circuit. An electronic apparatus test circuit in accordance with the present invention is equipped with a PLL circuit, an external clock circuit that outputs either a multiplied clock signal or an external clock signal according to the state of a test signal, a divider circuit that divides the multiplied clock signal or an external clock signal to generate and output a system clock signal for a logic circuit and a clock signal for an encoder circuit, an input cell, a reception circuit, a decoder circuit, a logic circuit that processes with a specified logic circuit decoded data according to a system clock signal for the logic circuit, an encoder circuit that encodes the processed data according to a clock signal for the encoder circuit, a transmission circuit that transmits the encoded data, and an output cell.

7 Claims, 4 Drawing Sheets

ELECTRONIC APPARATUS TEST CIRCUIT

BACKGROUND OF THE INVENTION

1. Field of the Invention

The present invention relates to an electronic apparatus test circuit to test PHY chips in conformity to IEEE 1394. More particularly, the invention relates to an electronic apparatus test circuit to test PHY chips in conformity to IEEE 1394, which can reduce testing time and cost without relying on a PLL circuit.

2. Description of the Related Art

FIG. 4 is a schematic that shows a related art electronic apparatus test circuit to test a PHY chip in conformity to IEEE 1394 of an electronic apparatus. In FIG. 4, the test circuit to test a PHY chip in conformity to IEEE 1394 of an electronic apparatus is equipped with a PLL (Phase-Locked Loop) circuit 47 that multiplies the frequency of a reference clock signal to a specified frequency, a divider circuit 49 that divides the multiplied frequency that is multiplied by the PLL circuit 47 to generate and output a system clock signal for a logic circuit and a clock signal for an encoder circuit, an input cell 41 that receives an input of data, a reception circuit 42 that receives data output from the input cell 41, a decoder circuit 43 that decodes data received by the reception circuit 42, a logic circuit 40 that processes with a specified logic circuit data decoded by the decoder circuit 43 according to the system clock signal for the logic circuit supplied from the divider circuit 49, an encoder circuit 46 that encodes data processed by the logic circuit 40 according to the clock signal for the encoder circuit supplied from the divider circuit 49, a transmission circuit 45 that transmits data encoded by the encoder circuit 46, and an output cell 44 that outputs data provided from the transmission circuit 45.

With this structure, when a PHY chip in conformity to IEEE 1394 is tested, a reference clock signal having a frequency of about 25 MHz is multiplied to about 400 MHz by the PLL circuit 47, and the multiplied clock signal that has been multiplied by the PLL circuit 47 is divided by the divider circuit 49 to generate a system clock signal for the logic circuit having a frequency of about 50 MHz which is output to the logic circuit 40, and to generate a clock signal for the encoder circuit having a frequency of about 400 MHz, about 200 MHz or about 100 MHz which is output to the encoder circuit 46. Then, a test signal to test is input as data, and its output result is confirmed, whereby the PHY chip in conformity to IEEE 1394 is verified.

SUMMARY OF THE INVENTION

However, with the related art electronic apparatus test circuit, it takes about 50–100 microseconds from the moment when the power supply is turned on until an output signal (multiplied clock signal) from the PLL circuit 47 stabilizes, which is problematical because the test requires a long time.

Also, the characteristics of the internal clock signal that is supplied to the logic circuit 40 and the encoder circuit 46 are dependent on the precision of the PLL circuit 47, which is an analog circuit. Therefore, depending upon the precision of the PLL circuit 47, the apparatus may be judged as a defective product even when other component circuits, such as the logic circuit 40, are normal, which results in the problem of high cost.

Accordingly, the present invention provides an electronic apparatus test circuit to test an I/O apparatus e.g. a PHY chip in conformity to IEEE 1394, which can reduce the testing time and cost without relying on a PLL circuit.

To address or solve the problems described above, an electronic apparatus test circuit in accordance with the present invention pertains to an electronic apparatus test circuit to test an I/O apparatus e.g. a PHY chip in conformity to IEEE 1394 of an electronic apparatus, which includes: a PLL (Phase-Locked Loop) circuit that multiplies a reference clock signal having a specified frequency; an external clock circuit that receives an input of a test signal, a multiplied clock signal that is multiplied to a specified frequency and output from the PLL circuit, and an external clock signal that is externally supplied and has a frequency identical with the specified frequency of the multiplied clock signal, and that outputs one of the multiplied clock signal and the external clock signal; and a divider circuit that divides the multiplied clock signal or the external clock signal output from the external clock circuit to generate and output a system clock signal for a logic circuit of the I/O apparatus and a clock signal for an encoder circuit of the I/O apparatus. The external clock circuit outputs the external clock signal when the test signal is ON.

The external clock circuit may include a first AND circuit that provides a logical product of the multiplied clock signal from the PLL circuit and an inverse signal of the test signal, a second AND circuit that provides a logical product of the external clock signal and the test signal, and an OR circuit that provides a logical sum of an output signal from the first AND circuit and an output signal from the second AND circuit, and outputs a clock signal having a frequency identical with the specified frequency of the multiplied clock signal.

The reference clock signal may preferably have a frequency of about 25 MHz, and the multiplied clock signal, the external clock signal and the test clock signal may preferably have a frequency of about 400 MHz, about 800 MHz, about 1600 MHz or about 3200 MHz.

The divider circuit may generate and output the system clock signal for the logic circuit having a frequency of about 50 MHz, and the clock signal for the encoder circuit having a frequency of about 3200 MHz, about 1600 MHz, about 800 MHz, about 400 MHz, about 200 MHz or about 100 MHz.

The divider circuit may generate and output the system clock signal for the logic circuit based on a speed code that is externally supplied. Also, the electronic apparatus test circuit is integrated in an I/O apparatus e.g. a PHY chip in conformity to IEEE 1394.

When the I/O apparatus is tested, since the external clock signal is used as a clock signal to provide testing, testing time and cost can be reduced without relying on a PLL circuit.

DETAILED DESCRIPTION OF PREFERRED EMBODIMENTS

An electronic apparatus test circuit to test a PHY chip in accordance with an embodiment of the present invention is described below with reference to the accompanying drawings.

Figure 1:
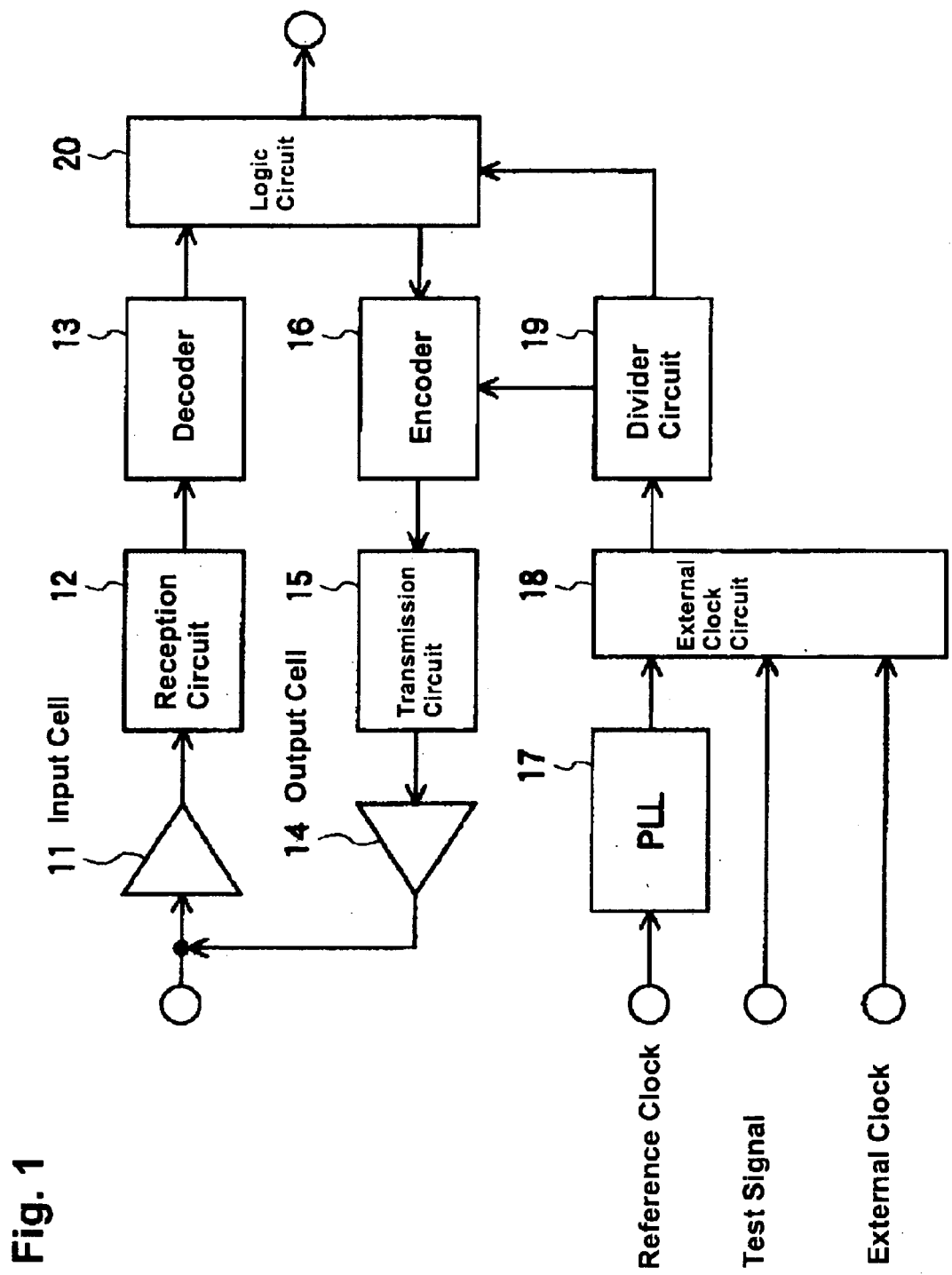
FIG. 1 is a schematic that shows an electronic apparatus test circuit in accordance with the present invention to test a PHY chip in conformity to IEEE 1394 of an electronic apparatus.

FIG. 1 is a schematic that shows an electronic apparatus test circuit in accordance with the present invention to test a PHY chip in conformity to IEEE 1394 of an electronic apparatus. In FIG. 1, the test circuit to test a PHY chip in conformity to IEEE 1394 of an electronic apparatus is equipped with a PLL (Phase-Locked Loop) circuit 17 that multiplies the frequency of a reference clock signal to a specified frequency, an external clock circuit 18 that selectively outputs either the multiplied clock signal that is multiplied by the PLL circuit 17 or an external clock signal, a divider circuit 19 that divides the multiplied clock signal output from the external clock circuit 18 or the external clock signal to generate and output a system clock signal for a logic circuit and a clock signal for an encoder circuit, an input cell 11 that receives an input of data, a reception circuit 12 that receives data output from the input cell 11, a decoder circuit 13 that decodes data received by the reception circuit 12, a logic circuit 20 that processes with a specified logic circuit data decoded by the decoder circuit 13 according to the system clock signal for the logic circuit supplied from the divider circuit 19, an encoder circuit 16 that encodes data processed by the logic circuit 20 according to a clock signal for the encoder circuit supplied from the divider circuit 19, a transmission circuit 15 that transmits data encoded by the encoder circuit 16, and an output cell 14 that outputs data provided from the transmission circuit 15.

Figure 2:
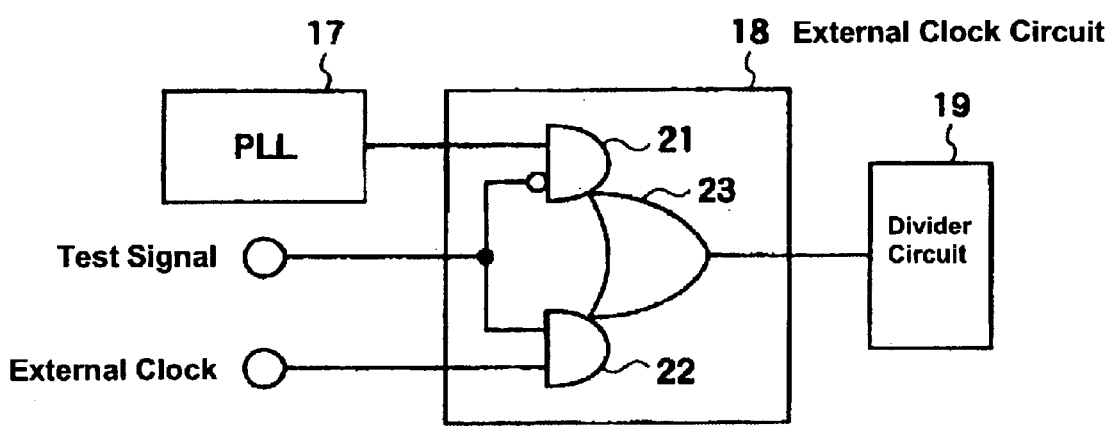
FIG. 2 is a schematic that shows a structure of an external clock circuit.

FIG. 2 is a schematic that shows a structure of the external clock circuit 18. The external clock circuit 18 is equipped with an AND circuit 21 that provides a logical product of the multiplied clock signal from the PLL circuit 17 and an inverse signal of the test signal, an AND circuit 22 that provides a logical product of the external clock signal and the test signal, and an OR circuit 23 that provides a logical sum of an output signal from the AND circuit 21 and an output signal from the AND circuit 22, and outputs a multiplied clock signal or an external clock signal.

With the structure of the external clock circuit 18 shown in FIG. 2, an external clock signal is output when the test signal is ON, and a multiplied clock signal is output when the test signal OFF.

In FIGS. 1 and 2, when a reference clock signal having a frequency of about 25 MHz is input, the PLL circuit 17 outputs a multiplied clock signal having a frequency of about 400 MHz, about 800 MHz, about 1600 MHz or about 3200 MHz. In this instance, the frequency of the external clock signal that is externally supplied is the same as the frequency of the multiplied clock signal.

The multiplied clock signal having a frequency of about 400 MHz, about 800 MHz, about 1600 MHz or about 3200 MHz, or the external clock signal is input in the divider circuit 19. The divider circuit 19 generates a system clock signal for the logic circuit having a frequency of about 50 MHz and outputs the same to the logic circuit 20. Also, it generates a clock signal for encoder circuit having a frequency of about 3200 MHz, about 1600 MHz, about 800 MHz, about 400 MHz, about 200 MHz or about 100 MHz, and outputs the same to the encoder circuit 16.

With the use of an external clock signal and the structure of the external clock circuit 18, the external clock signal is output when the test signal is ON, and the multiplied clock signal is output when the test signal is OFF.

With this structure, when the PHY chip in conformity to IEEE 1394 is tested, the test signal is ON, and therefore the multiplied clock signal that is output from the PLL circuit 17 is not used, such that the external clock signal that is externally supplied is output from the external clock circuit 18. The divider circuit 19 divides the external clock signal and generates a system clock signal for the logic circuit (for test) having a frequency of about 50 MHz and outputs the same to the logic circuit 20, and it also generates a clock signal for the encoder circuit (for test) having a frequency of about 3200 MHz, about 1600 MHz, about 800 MHz, about 400 MHz, about 200 MHz or about 100 MHz, and outputs the same to the encoder circuit 16. By inputting a test signal for test as data, and confirming its output result, the PHY chip in conformity to IEEE 1394 can be verified.

In this manner, when the PHY chip in conformity to IEEE 1394 is tested, the external clock signal is used as a clock signal for test. As a result, testing time and the cost can be reduced without relying on the PLL circuit 17.

Figure 3:
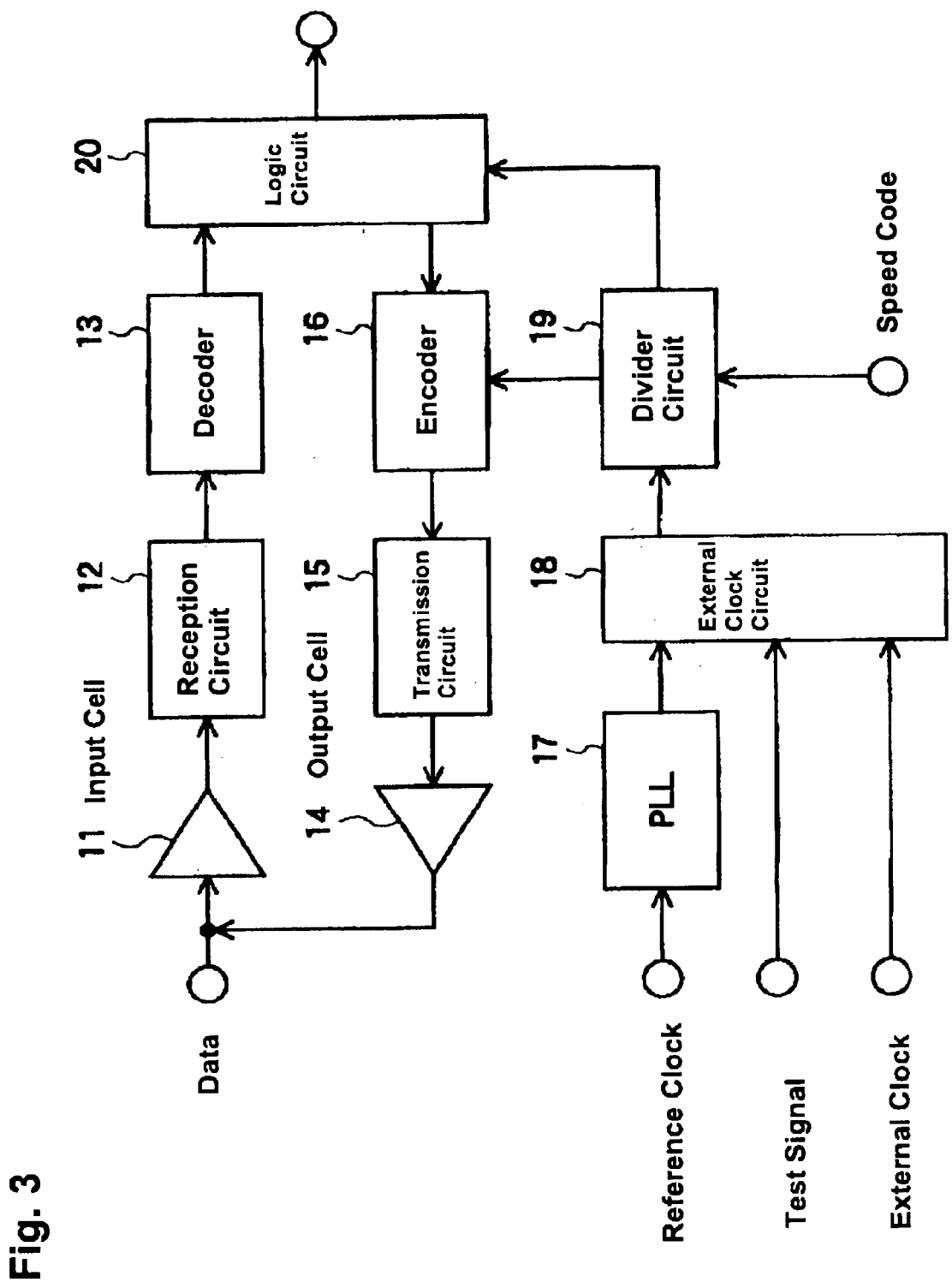
FIG. 3 is a schematic that shows another example of an electronic apparatus test circuit in accordance with the present invention to test a PHY chip in conformity to IEEE 1394 of an electronic apparatus.
Figure 4:
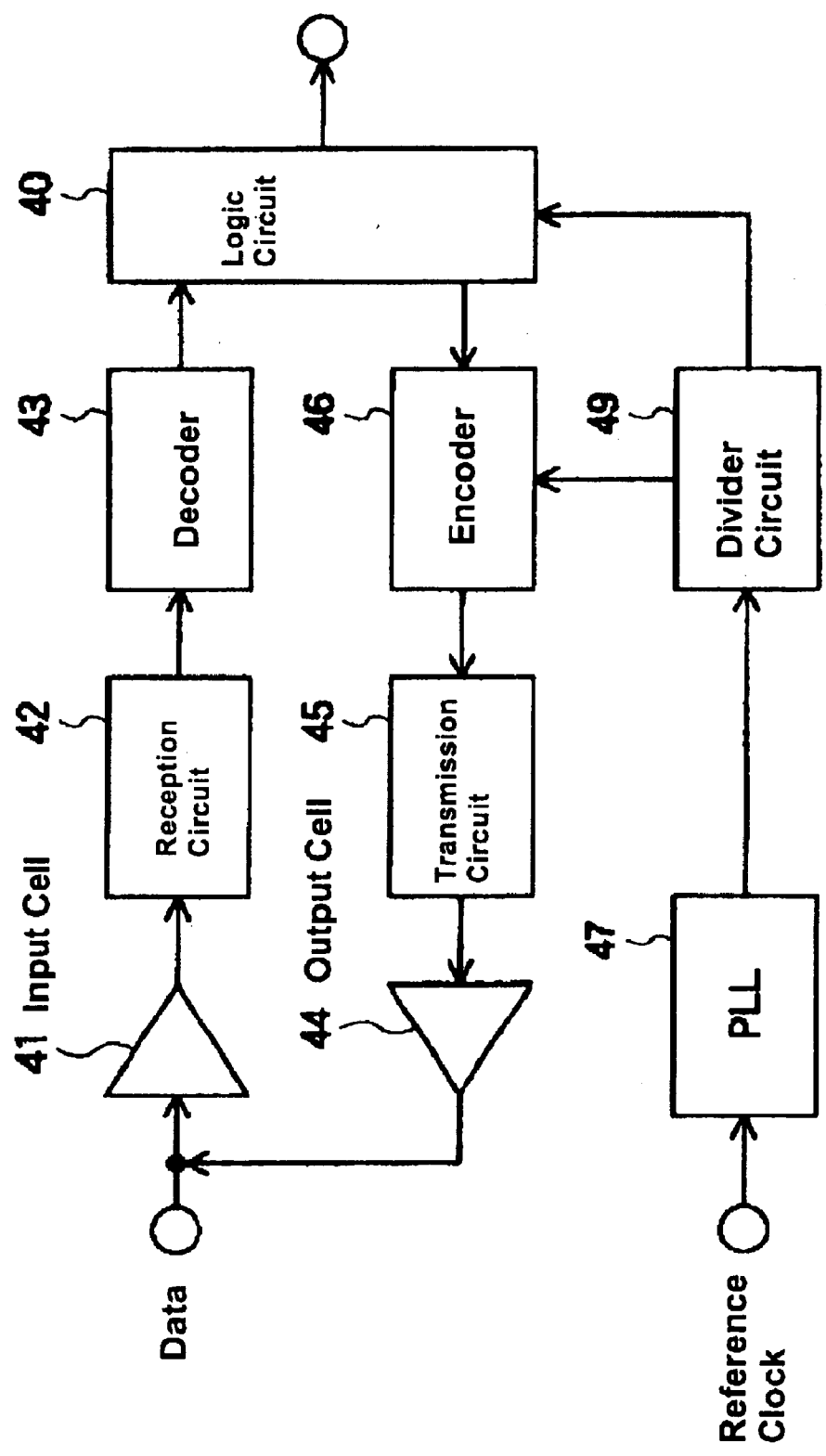
FIG. 4 is a schematic that shows a related art electronic apparatus test circuit to test a PHY chip in conformity to IEEE 1394 of an electronic apparatus.

FIG. 3 is a schematic that shows another example of an electronic apparatus test circuit in accordance with the present invention to test a PHY chip in conformity to IEEE 1394 of an electronic apparatus. A difference between FIG. 3 and FIG. 1 is that, in FIG. 3, a speed code signal is supplied to the divider circuit 19. By this, the divider circuit 19 generates and outputs a system clock signal for the logic circuit based on the speed code signal that is externally supplied. As a result, a system clock signal for the logic circuit having a low frequency can be supplied to the logic circuit 20. For example, when a clock signal having a frequency of about 400 MHz and a signal having a speed code "⅛" are input in the divider circuit 19, in the example described above, the frequency of the system clock signal for logic circuit is about 400 MHz ⅛=about 50 MHz.

In this manner, with inexpensive logic data (speed code signals), the frequency of system clock signals for the logic circuit can be determined, and in particular, tests with low speed frequencies can be readily conducted.

[Effects of the Invention]

As described above, with the electronic apparatus test circuit in accordance with the present invention, when a PHY chip in conformity to IEEE 1394 is tested, an external clock signal is used as a clock signal for test. As a result, testing time and cost can be reduced without relying on a PLL circuit.

What is claimed is:

1. An electronic apparatus test circuit to test an I/O apparatus having a logic circuit and an encoder circuit, comprising:

a PLL (Phase-Locked Loop) circuit that multiplies a reference clock signal having a specified frequency;

an external clock circuit that receives an input of a test signal, a multiplied clock signal that is multiplied to a specified frequency and output from the PLL circuit, and an external clock signal that is externally supplied and has a frequency identical with the specified frequency of the multiplied clock signal, and that outputs one of the multiplied clock signal and the external clock signal; and a divider circuit that divides one of the multiplied clock signal and the external clock signal output from the external clock circuit to generate and output a system clock signal for the logic circuit of the I/O apparatus and a clock signal for the encoder circuit of the I/O apparatus, the external clock circuit outputting the external clock signal when the test signal is ON.

2. The electronic apparatus test circuit according to claim 1, the external clock circuit including:
- a first AND circuit that provides a logical product of the multiplied clock signal from the PLL circuit and an inverse signal of the test signal;
- a second AND circuit that provides a logical product of the external clock signal and the test signal; and
- an OR circuit that provides a logical sum of an output signal from the first AND circuit and an output signal from the second AND circuit, and outputs a clock signal having a frequency identical with the specified frequency of the multiplied clock signal.

3. The electronic apparatus test circuit for testing the I/O apparatus according to claim 1, wherein, the I/O apparatus is a PHY chip in conformity to IEEE1394.

4. The electronic apparatus test circuit according to claim 1, the reference clock signal having a frequency of about 25 MHz, and the multiplied clock signal, the external clock signal and the test clock signal having a frequency of about 400 MHz, about 800 MHz, about 1600 MHz or about 3200 MHz.

5. The electronic apparatus test circuit according to claim 3, the divider circuit generating and outputting the system clock signal for the logic circuit having a frequency of about 50 MHz, and the clock signal for the encoder circuit having a frequency of about 3200 MHz, about 1600 MHz, about 800 MHz, about 400 MHz, about 200 MHz or about 100 MHz.

6. The electronic apparatus test circuit according to claim 1, the divider circuit generating and outputting the system clock signal for the logic circuit based on a speed code that is externally supplied.

7. The electronic apparatus test circuit according to claim 1, the electronic apparatus test circuit being integrated in an I/O apparatus in conformity to IEEE 1394.

* * * * *